United States Patent [19]
Kuglin

[11] Patent Number: 5,835,506
[45] Date of Patent: Nov. 10, 1998

[54] SINGLE PASS DOUBLET MODE INTEGRATED CIRCUIT TESTER

[75] Inventor: Philip T. Kuglin, Tualatin, Oreg.

[73] Assignee: Credence Systems Corporation, Fremont, Calif.

[21] Appl. No.: 845,942

[22] Filed: Apr. 29, 1997

[51] Int. Cl.$^6$ ................................................ G01R 31/28
[52] U.S. Cl. ........................................ 371/27.1; 371/22.1
[58] Field of Search .................................. 371/27.1, 22.1, 371/21.1, 21.2, 27.5, 27.7, 24; 324/73.1, 765; 365/189.07, 201

[56] References Cited

U.S. PATENT DOCUMENTS

| | | | |
|---|---|---|---|
| 4,682,330 | 7/1987 | Millham | 371/27.1 |
| 5,381,421 | 1/1995 | Dickol et al. | 371/27.1 |
| 5,617,431 | 4/1997 | Tupuri et al. | 371/27.1 |

Primary Examiner—Hoa T. Nguyen
Attorney, Agent, or Firm—Smith-Hill and Bedell

[57] ABSTRACT

An integrated circuit tester includes a set of pin electronics circuits, each for carrying out a sequence of activities at a separate terminal of a device under test (DUT) in response to an input vector sequence. Such activities may include sending a test signal to the DUT terminal or ascertaining the state of a DUT output signal at the terminal. Each pin electronics circuit can operate in either of two modes, normal and doublet. The test is organized into a set of successive test cycles. When operating in the normal mode, a pin electronics circuit interprets each successive input vector as defining activities to be carried out during a single cycle of the test. When operating in the doublet mode, a pin electronics circuit interprets each successive input vector as defining activities to be carried out during two successive test cycles.

6 Claims, 4 Drawing Sheets

SINGLE PASS DOUBLET MODE INTEGRATED CIRCUIT TESTER

BACKGROUND OF THE INVENTION

1. Field of the Invention

The present invention relates in general to integrated circuit testers and in particular to a system for doubling the maximum speed of an integrated circuit tester.

2. Description of Related Art

An integrated circuit tester sends test signals to input terminals of a digital integrated circuit device under test (DUT) and then determines the logic states of output signals the DUT produces in response to the test signals. A typical integrated circuit tester includes a set of nodes, one for each terminal of the DUT. Each node includes a pin electronics circuit which can either send a test signal to the DUT terminal or ascertain the state of a DUT output signal produced at the DUT terminal. A test is organized into a set of successive test cycles, and at the start of each test cycle each pin electronics circuit receives an input vector. A "vector" is a data word conveying a code indicating what the pin electronics circuit is to do during the test cycle and when during that test cycle it is to do it. Each tester node also includes a random access memory for storing a set of vectors to be sent to the pin electronics during the test. A central sequencer sends an address concurrently to the vector memories of all nodes before the start of each test cycle. The vector memory of each tester node reads out a vector stored at that address and delivers the vector to the local pin electronics circuit at the start of the test cycle.

Thus a test is defined by the vectors stored in the vector memories and by the order in which the sequencer tells the vector memories to read out the vectors to the pin electronics circuits during the test. In many integrated circuit testers the manner in which the pin electronics circuits interpret and respond to their input vectors is also programmable. A vector has only a limited number of bit with which to tell a pin electronics circuit what to do during a test cycle. Various bits of a vector have defined meanings. For example in a typical 8-bit vector, a "drive enable" bit indicates whether the test signal output of the pin electronics circuit is to be enabled. A "drive" bit indicates a state to which the test signal is to be driven during the cycle if enabled. Two "compare" bits define expected values for the DUT output signal at one or two times during the test cycle. The remaining four "timeset" bits typically define a drive or compare timing format that the pin electronics is to employ during the cycle. When the pin electronics is to generate a test signal, the timeset bits indicate one or more times during the cycle at which the test signal is to be driven to the state indicated by the drive bit and times at which the signal is to be driven to the opposite state. The timeset bits may also indicate a time or a window period during the cycle at which the pin electronic circuit is to ascertain the current state of the DUT output signal A pin electronics circuit is usually capable of executing such a wide variety of test signal drive and compare formats that the 4-bit timeset data does not have enough distinct values to permanently assign a separate vector value to each possible pattern. We could increase the size of the timeset data portion of a vector so that each possible format would have a permanently assigned timeset value. But in doing so we would have to increase the size of the vector memories. Fortunately, although not all integrated circuit tests use the same drive and compare formats, an integrated circuit test normally does not require a very wide range of drive or sampling patterns. Pin electronics circuits are therefore programmable so that the particular drive or compare format that it executes in response to each value of the 4-bit timeset data can be selected to suit the particular IC to be tested.

Thus a test is defined not only by the vectors stored in the vector memories and by the order in which the master sequencer tells the vector memories to read out the vectors to the pin electronics circuits during the test, but also by the manner in which the pin electronics circuits are programmed to interpret and respond to the vectors.

Vector memories are a major part of the cost of an integrated circuit tester and vector memory access speed has been an obstacle to increasing the speed (i.e. decreasing the minimum test cycle period) of integrated circuit testers. A separate vector memory is required for each pin of an IC being tested, and modern IC's can have hundreds of pins. Also a large tester can test more than one IC concurrently. Thus a tester may require hundreds or even thousands of vector memories. Since IC tests can sometimes require millions of test cycles, vector memories must be large enough to hold millions of vectors. Vector memories must also be fast. The duration of a test cycle is normally matched to the speed of the DUT. If a DUT operates at 10 MHz, then a test cycle is suitably 1/10 Mhz or 100 nsec. Since a vector memory has to supply a vector during each test cycle, a vector memory testing a 10 MHz test must have a 100 nsec access time. As IC speeds have increased to 200 MHz and beyond, faster tester memories are required. Some high speed testers are able to use slower memories by storing more than one vector at each vector memory address.

As the size and number of vector memories has increased, so too has the time required to load vectors into the vector memories when programming a tester to perform a test. "Multiple pass" testing reduces the amount of vector data that is needed to test an IC by using all or a part of the vector data during two separate phases of the test. The pin electronics circuits are reprogrammed after the each test pass so that they respond to the vector data in a different manner during a next pass.

What is needed is an integrated circuit tester which can make efficient use of its vector memory capacity and which can operate at high speeds while employing relatively slow vector memories.

SUMMARY OF THE INVENTION

An integrated circuit tester in accordance with the present invention includes a set of tester nodes, each node being connected to a separate terminal of a circuit device under test (DUT). Each node includes a vector memory and a pin electronics circuit. A test is organized into a succession of test cycles. During each test cycle, each pin electronics circuit may either send a test signal to a DUT terminal or ascertain the state of a DUT output signal at the terminal and compare it to an expected state. During a test, a master sequencer sends a sequence of addresses concurrently to each vector memory causing each vector memory to read out a sequence of vectors (data words) to its local pin electronics circuit. The sequence of vector data defines a sequence of actions the pin electronics circuit carries during the test.

In accordance with one aspect of the invention, each pin electronics circuit can operate in either of two modes—normal or doublet. When operating in the normal mode, each pin electronics circuit interprets each incoming vector as defining activities to be carried out during a single test cycle. When operating the doublet mode, each pin electronics circuit interprets an incoming vector as defining activities to be carried out during two successive test cycles. The normal mode is used when a pin electronics circuit is to produce complex drive or compare formats or is to employ a relatively wide range of drive or compare formats during a test. The doublet mode may be used when the pin electronics circuit is to carry out relatively fewer and less complex drive and compare formats during a test.

When maximum tester rate is limited by vector memory access time, a doublet mode test can be carried out at twice the speed of a normal mode test because a vector memory need read out a vector only half as often in the doublet mode. Also, since in doublet mode a vector defines activities spanning two test cycles instead of one, only half as many doublet mode vectors are needed to define a test. This reduces the amount of time required to load vector memories before a test.

In accordance with another aspect of the invention, the master sequencer transmits a mode control signal to the pin electronics circuit during the test. The mode control signal indicates whether the pin electronics circuits are to operate in normal or doublet mode. Thus the tester can switch back and forth between modes during a test.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in block diagram form an integrated circuit tester in accordance the present invention, FIG. 2 illustrates a typical pin electronics circuit of the tester of FIG. 1 in more detailed block diagram form, FIG. 3 illustrates the drive control circuit of the pin electronics circuit of FIG. 2 in more detailed block diagram form, FIG. 4 is a timing diagram illustrating typical normal mode drive formats produced by the drive control circuit of FIG. 3, FIG. 5 is a timing diagram illustrating typical doublet mode drive formats produced by the drive control circuit of FIG. 3, and FIG. 6 illustrates the compare circuit of FIG. 2 in more detailed block diagram form, FIG. 7 is a timing diagram illustrating normal mode compare strobe timing of the compare circuit of FIG. 6, and FIG. 8 is a timing diagram illustrating doublet mode strobe timing of the compare circuit of FIG. 6.

DESCRIPTION OF THE PREFERRED EMBODIMENT(S)

Figure 1:
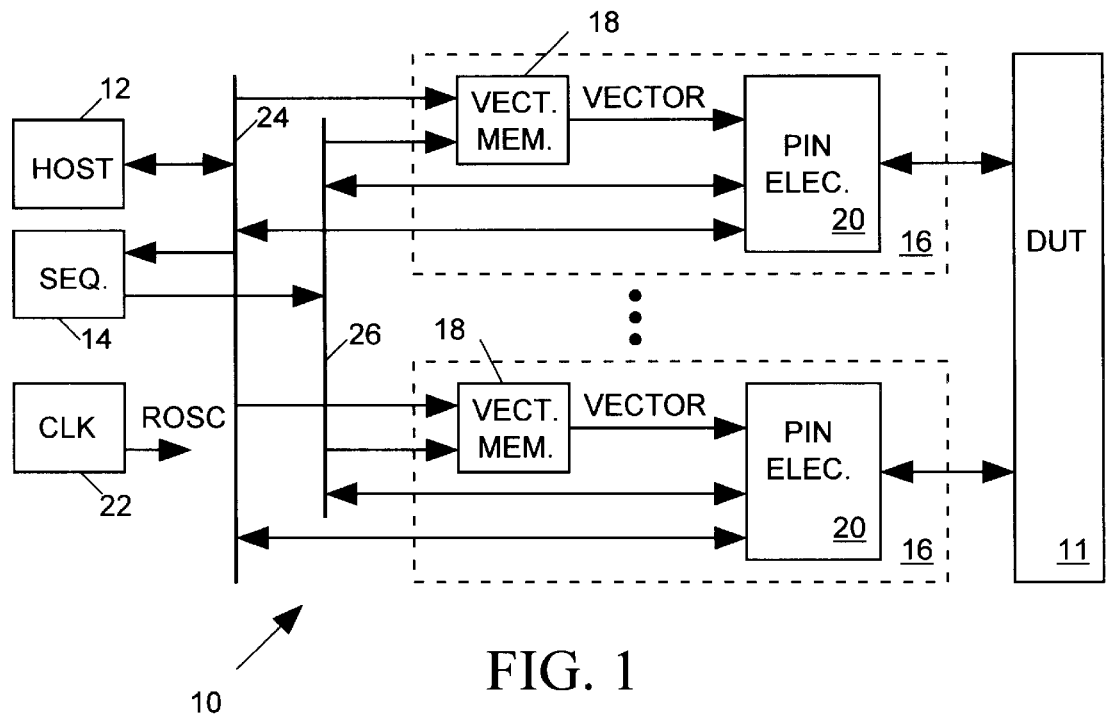

FIG. 1 illustrates an circuit tester 10 for testing an integrated circuit device under test (DUT) 11. Tester 10 includes a host computer 12, a master sequencer 14 and a set of tester nodes 16, one for each input/output terminal of DUT 11. Each node 16 includes a random access vector memory 18 and a pin electronics circuit 20. A master clock 22 supplies a clock signal ROSC to all other devices of tester 10 as a timing reference for their activities.

A test is organized into a succession of test cycles. During each test cycle the pin electronics circuit 20 of each node 16 may carry out a test activity at the DUT terminal 11. During a test, the vector memory 18 of each node 16 supplies a sequence of 8-bit data words ("vectors") to the local pin electronics circuit 20. The vector sequence tells the pin electronics what to do during each cycle of the test. For example a pin electronics circuit 20 may send an output test signal to DUT 11 during the test cycle. Another pin electronics circuit 20 may, for example, compare DUT 11 output signals to high or low logic levels during the test cycle and store data in an internal acquisition memory indicating the results of the comparisons.

To program tester 10, host computer 12 transmits data via a computer bus 24 to sequencer 14, vector memories 18 and pin electronics circuits 20. The vector memories 18 each receive and store a separate set of vectors. Each pin electronics circuit 20 receives data defining the high and low logic levels of DUT 11 and data indicating what the pin electronics circuit is supposed to do in response to each vector data value. Host computer 12 provides sequencer 14 with instructions indicating the duration of the test cycles and an order in which vector memories 18 are to read out vectors to pin electronics circuits 20 during the test.

After programming tester 10, host computer 12 sends a START command to sequencer 14 via computer bus 24 telling sequencer 14 to begin the test. Sequencer 14 then begins sending a sequence of addresses to the vector memories 18 via a parallel bus 26. As each vector memory 18 receives an address, it reads out a vector stored at that address and delivers it to its local pin electronics circuit 20. Normally a vector is delivered to each pin electronics circuit 20 at the beginning of a test cycle. Each pin electronics circuit 20 decodes the vector to determine the test activities that it is supposed to perform at the DUT terminal during the test cycle, and then does it. When the test is complete, sequencer 14 signals host computer 12 via bus 24. Host computer 12 may then read data out of the acquisition memories within pin electronics circuits 20 and analyze that data to determine how DUT 11 responded to the test.

Normal and Doublet Modes

In accordance with the invention, tester 10 can operate in either of two modes, normal and doublet. The instructions from host computer 12 tell sequencer 14 to supply a mode control signal in parallel to each pin electronics circuit 20 via bus 26 during each cycle of the test. The mode control signal indicates whether tester 10 is to operate in the normal or doublet mode. In the normal mode of operation each vector input to a pin electronics circuit 20 references test actions to be carried out during the next test cycle. In the doublet mode, each vector input to a pin electronics circuit 20 defines test actions to be carried out during the next two test cycles. Thus in the normal mode a vector memory 18 produces one output vector for each cycle of the test whereas in the doublet mode a vector memory 18 produces one output vector for every two test cycles.

The normal mode is used, for example, when a pin electronics circuit 20 is to produce a relatively complex test signal waveform during any test cycle, or is to carry out a relatively wide range of activities during a test. In such case the entire width of a vector is needed to select the particular activity for each test cycle. The doublet mode may be used when a pin electronics circuit is to carry out a limited range of relatively less complex activities during each cycle of a the test. Under those conditions, one 8-bit doublet mode vector is sufficiently large to select the particular test activities to be carried out during two successive test cycles.

Since the maximum tester rate is limited by the minimum read access times of vector memories 18, a test employing only doublet mode vectors can be carried out at up to twice the maximum speed of a normal mode test because a vector memory need read out a doublet mode vector only once for every two test cycles. Also, since in the doublet mode a vector defines activities spanning two test cycles instead of one, only half as many doublet mode vectors are needed to define a doublet mode test as are needed to define a normal mode test. By reducing the number of vectors needed to define a test, the doublet mode reduces the amount of time required to load vector memories before a test. The doublet mode can also increase the number of test cycles that a test can span for a given vector memory size. However, as shall be seen below, the range of test activities performed by a pin electronics circuit 20 when operating in the doublet mode is more limited than when it operates in the normal mode. Thus the capability of operating in either normal or doublet mode give the tester flexibility in meeting DUT test objectives.

Normal Mode Vector Encoding

An 8-bit normal mode vector is encoded in a manner well-known to those skilled in the art. Each normal mode vector includes two drive bits DM[1:0], two compare bits CM[1:0], and four timeset bits TS[3:0]. The two drive bits DM[1:0] and the four timeset bits TS of a normal mode vector indicate the pattern of the test signal the pin electronics circuit 20 is to send to DUT 11 during a test cycle. The DM[0] drive bit indicates whether the test signal is to be enabled or tristated during the test cycle. The DM[1] bit refers to a particular test signal logic state. At any given time during a cycle, an output test signal can be of the (high or low) logic state indicated by the DM[1] bit, can be of the opposite logic state, or can be tristated (not enabled). The value of the four TS[3:0] bits select a particular drive format to be used during the test cycle. A "drive format" is a particular sequence of state changes the test signal is to undergo during the test cycle and includes the timing of the state changes during a test cycle. Each value of a normal mode vector may refer to a different drive format. The normal mode drive formats are defined by the programming data the host computer 12 supplies to each pin electronics circuit 20 before the test. Each pin electronics circuit 20 may be programmed to interpret vectors differently.

The four possible values of the two compare bits CM[1:0] together indicate an expected state of the DUT 11 output signal. The DUT 11 output signal can be expected to be either logically high, logically low, or tristated. The DUT output signal is considered to be "tristated" if it is between high an low logic levels. The fourth possible value of the compare bits CM[1:0] indicates that no particular DUT 11 output signal state is expected ("don't care"). During each test cycle, each pin electronics circuit 20 samples the signal at the DUT 11 terminal and compares it to high and low reference voltages to determine its state. It then compares the state of the DUT output signal to the state indicated by the compare CM[1:0] bits. If compare bits indicate that the DUT output state (if expected) does not match the state indicated by the compare bits, the pin electronics circuit 20 sends a FAIL signal to sequencer 14 via bus 26. Depending on how it is programmed, sequencer 14 may respond to a FAIL signal by terminating the test.

Each pin electronics circuit 20 also stores the two-bit result of its DUT output signal sampling for each cycle of the test in an internal acquisition memory. After the test is completed, host computer 12 may read the data out of the acquisition memory of each pin electronics circuit 20 and analyze the data to ascertain test results.

The four timeset bits TS[3:0] of a normal mode vector also indicate a DUT 11 output signal compare format. The compare format defines the times during a test cycle at which a DUT output signal is sampled to determine its state. The compare format also defines a manner in which the output signal states are compared to expected states (bits CM[1:0]) when determining whether the comparison passes of fails. In the normal mode of operation there are two possible compare modes—edge and window. In the edge mode, the DUT 11 output signal is sampled at one particular time during a test cycle, the sampling time being indicated by the timeset bits. The magnitude of the output signal sample taken at that one time is then compared to the high and low reference levels to determine the (two-bit) state of the output signal. That state is then compared to the expected state CM[0:1] to determine whether to trigger the FAIL signal. In the window mode the output signal is monitored through a time window within the test cycle and a FAIL signal is generated if at any time during that time window the DUT output signal switches to an unexpected state. In the window mode, timeset bits TS[3:0] indicate the starting and ending times of the time window.

Doublet Mode Vector Encoding

Individual bits of a doublet mode vector do not have predetermined functions such as do the drive, compare and timeset bits of a normal mode vector. Instead an incoming doublet mode vector simply addresses a RAM-based lookup table within the pin electronics circuit, and addressed data in the lookup table sets the particular drive or compare formats during the next two consecutive cycles of the test. By choosing data values at each address of the lookup table within each pin electronics circuit 20, the host computer 12 determines the types of doublet mode drive and compare format that can be executed during the test. Since no doublet mode vector bits have any fixed meaning, the set of pin electronics circuit operations that can be referenced by a doublet mode vector can be flexibly chosen.

Pin Electronics Circuit

Figure 2:
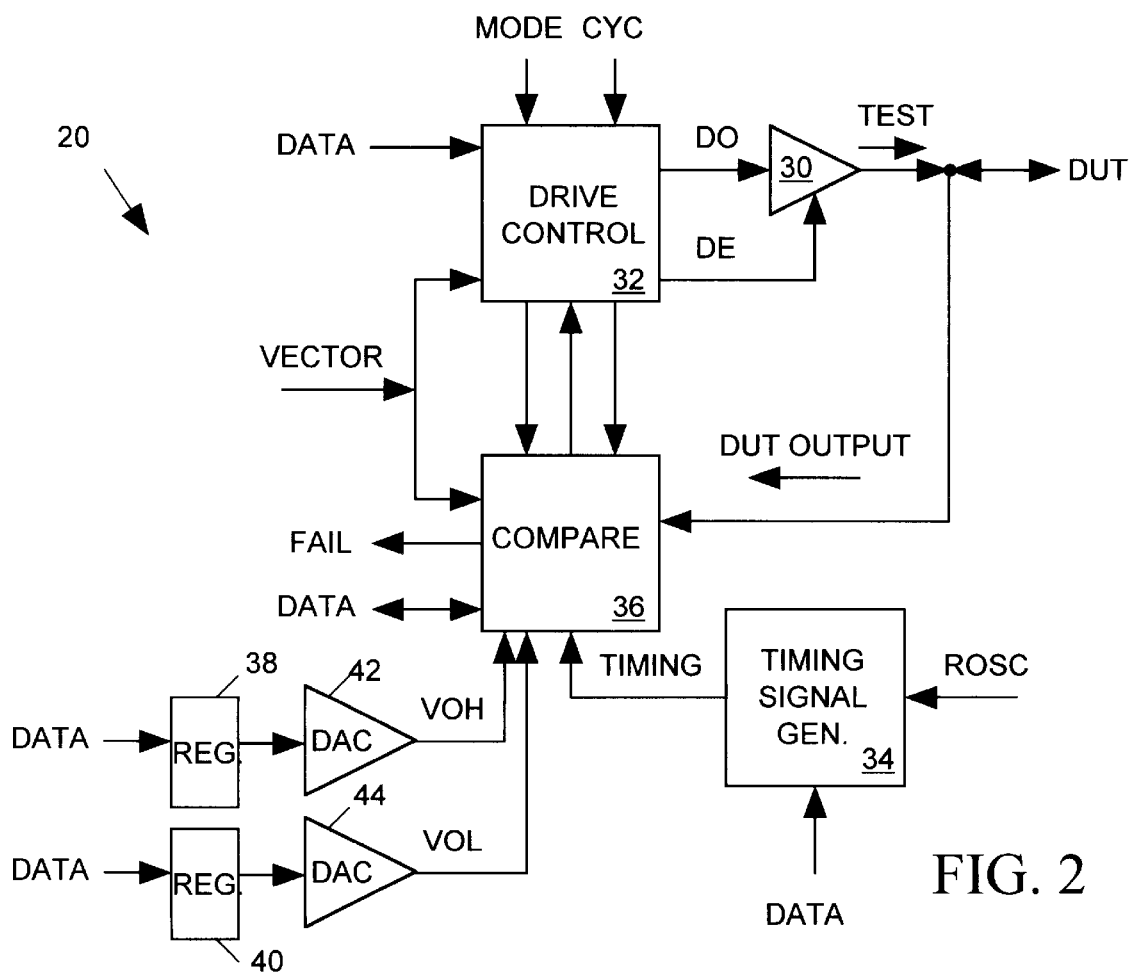

FIG. 2 illustrates a typical pin electronics circuit 20 of FIG. 1 in more detailed block diagram form. Pin electronics circuit 20 includes a tristate driver 30 for producing the test signal supplied to the DUT. A drive control circuit 32 generates an output signal DO controlling the input of driver 30, and also generates a signal DE for enabling driver 30. Drive control circuit 32, programmed by data from host computer 12 of FIG. 1, controls states of the DO and DE signals in response to an incoming normal or doublet mode vector. A MODE signal produced by sequencer 14 of FIG. 1 tells drive control circuit 32 whether the incoming vector is a normal or doublet mode vector. The programming data from host computer 12 tells drive control circuit 32 how to interpret normal and doublet mode vectors when formatting the output test signal. Pulses of a CYC signal from sequencer 14 mark the start of successive test cycles. Drive control circuit 32 times each edge of a DO or DE signal with reference to a set of TIMING signals produced by a conventional timing signal generator 34 driven by the ROSC clock signal. The TIMING signals have the same frequency as the CYC signal but are evenly distributed in phase so as to evenly divide each test cycle of the test into a set of subintervals that can be used as timing references during each test cycle.

A compare circuit 36 samples the DUT output signal, compares the sample(s) to expected values and sends a FAIL signal back to sequencer 14 when the samples don't match expected values. It also stores the sample values as test result data in an internal acquisition memory which may be read and analyzed by the host computer 12 after the test. Before starting the test host computer 12 loads data into a pair of registers 38 and 40 to define the DUT's high and low logic levels. Digital-to-analog converters 42 and 44 convert the data in registers 38 and 40 to analog signals VOH and VOL matching the lower limit of the high level voltage and the upper limit of the low logic level voltage. Compare circuit 36 compares the DUT output signal sample to these signals when determining the state of the DUT output signal. Compare circuit 36 uses the TIMING signals from generator 34 as timing references when sampling the DUT output signal. Incoming normal and doublet mode vectors tell compare circuit 36 what the expected high and low values are and how and when to sample the DUT output signal during each test cycle. Host computer 12 of FIG. 1 supplies programming data to compare circuit 36 telling it how to interpret normal and doublet mode vectors. The MODE signal also tells compare circuit 36 whether the incoming vector is a normal or doublet mode vector. The MODE and CYC signals from sequencer 14 of FIG. 1 also tell compare circuit 36 whether an incoming vector is a normal or doublet mode vector and indicate the start of each test cycle.

Drive Control Circuit

Figure 3:
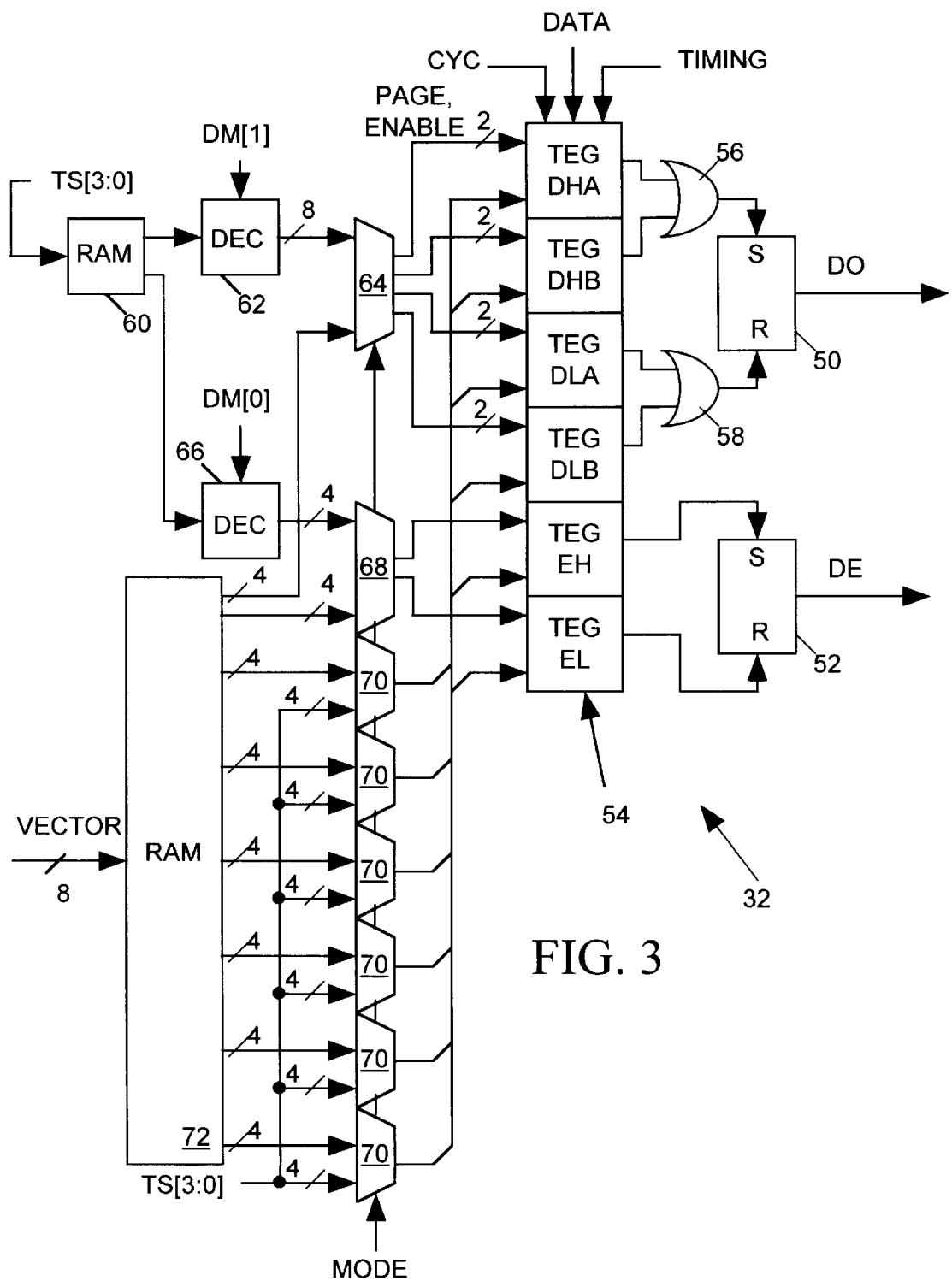

FIG. 3 illustrates drive control circuit 32 of FIG. 2 in more detailed block diagram form. Drive control circuit 32 includes a flip-flop 50 for generating the DO signal supplied to tristate driver 30 of FIG. 2 and a flip-flop 52 for generating the DE signal enabling driver 30. A set of six conventional time event generators (TEG's) 54 control set and reset operations of the two flip-flops 50/52. When output enabled, each TEG 54 produces an output signal pulse once after each CYC signal pulse. Each TEG 54 produces its output pulse a short time after it detects an edge of a selected one of the phase-distributed TIMING signals produced by timing signal generator 34 of FIG. 2. The incoming vector indicates which of TEG's 54 are input enabled, tells each enabled TEG 54 which TIMING signal to select as a reference for its output signal pulse timing, and indicates how long to wait after detecting a selected TIMING signal pulse before producing the TEG output signal pulse.

An OR gate 56 ORs the outputs of two drive high TEG's 54 (DHA and DHB) to produce a signal controlling the set input of flip-flop 50. An OR gate 58 ORs the output of two drive low TEG's 54 (DLA and DLB) to produce a signal controlling the reset input of flip-flop 50. Since the timing of the output pulses of TEG's DHA, DHB, DLA and DLB can be independently adjusted, flip-flop 50 can be set and reset up to two times after each CYC pulse. Thus the DO signal may switch between high and low logic states up to four times after each CYC pulse. Another pair of TEG's 54 (EH and EL) control the set and reset inputs of flip-flop 52. The DE signal can therefore change state up to two times after each CYC pulse.

Depending on which TEG's 54 an incoming vector enables, and on how the vector tells them to time their output pulses after a CYC pulse, drive control circuit 32, operating through driver 30 of FIG. 2, can produce an output test signal which exhibits any of a wide variety of patterns between successive CYC signal pulses. It can switch between tristate and enabled up to two times and can switch between high and low logic levels up to four times between CYC signal pulses. The timing of state changes is quite flexible and can be selected with a high degree of resolution.

Thus the number of different of possible drive signal formats that pin electronics circuit 30 can produces is very large. Since a vector is only 8 bits, it can only take on 256 unique values—not a sufficient number distinctly values to allow the vector to select from among all possible drive patterns that might be employed during one or two test cycles. Thus host computer 12 must program various components of drive control circuit 32 to define the particular drive signal pattern to be produced in response to each incoming vector. Normal and doublet mode vectors are separately encoded.

The TS[3:0] bits of an input normal mode vector address a small RAM 60 containing data supplied by host computer 12. The data at each address defines a particular one of 16 drive signal formats that may be selected by an incoming vector. A decoder 62 decodes some of that data, in combination with vector bit DM[1] to produce four PAGE and four ENABLE signals. A multiplexer 64, controlled by the MODE signal, delivers one PAGE and one ENABLE signal to each of the four TEG's DHA, DHB, DLA and DLB during normal mode operation. A second decoder 66 decodes additional output bits of RAM 60, in combination with vector bit DM[0], to produce PAGE and ENABLE signals delivered via another multiplexer 68 to TEG's EH and EL during normal MODE operation. A set of multiplexers 70 deliver the timeset bits TS[3:0] of a normal mode vector to each TEG 54. Each TEG 54 includes a small internal RAM addressed by the four incoming TS[3:0] bits and one of the two bits from decoder 62 or 66. Data at each of the 32 storage locations in the RAM indicates which of the TIMING signals is to control the timing of the TEG's output pulse and also indicates the amount of time by which the TEG is to delay after detecting the selected TIMING signal pulse before producing its output signal, when enabled. By appropriately storing data at each address of the RAM within each TEG 54, host computer 12 can adjust the timing of test signal edges for each of the 16 drive formats defined by the data in RAM 60.

Normal Mode Drive Circuit Programming

Figure 4:
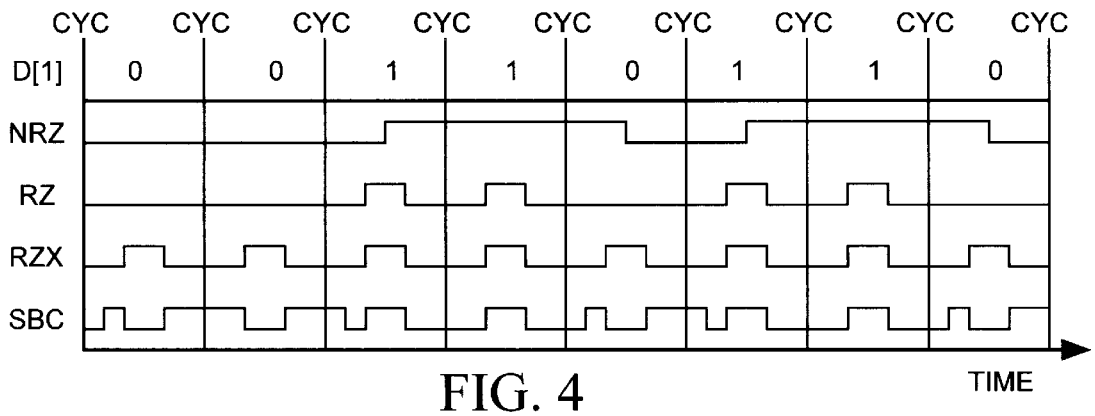

FIG. 4 is a timing diagram illustrating a few examples of typical normal mode drive formats for the output test signal. (Many more formats are possible.) The timing diagram of FIG. 4 shows eight consecutive cycles for each format. In this example the D[0] vector bit is always true so that driver 30 is always enabled. The D[1] vector bit is a logic "0" for the first, second, fifth, sixth and eighth test cycles and a logic "1" for the remaining test cycles.

A "non-return to zero" format (NRZ) drives the test signal low during any test cycle in which the D[1] bit is a 0 and drives the test signal high during any test cycle in which the D[1] bit is a 1. Referring to FIG. 3, to achieve the NRZ format for some value of TS[3:0] (for example TS[3:0]= (0011), the data at address 0011 of RAM 60 is set so that when sent to decoder 62 while DM[1] is a 0, TEG DLA is enabled and so that when DM[1] is a 1, TEG DHA is enabled. The data stored at address 0011 of RAM 66 is set to enable TEG EH. TEG EH is programmed to respond to TS[3:0]=(0011) by generating its output pulse at the start of each test cycle, thereby ensuring that the test signal is enabled. TEG's DHA and DLA are programmed to respond to TS[3:0]=(0011) by producing their output pulses (when output enabled) at the middle of each cycle. Note that the NRZ format enables only three of the six TEG's.

A "return to zero" format (RZ) keeps the test signal low when D[1] is a 0 and pulses the test signal briefly high when D[1] is a 1. To achieve the RZ format for some value of TS[3:0] (for example TS[3:0]=(1100), the data at address 1100 of RAM 60 is set so that TEG EH is enabled and TEG EH is programmed to respond to TS[3:0]=(1100) by generating an output pulse at the beginning of the cycle to ensure that the test signal is enabled. Data at address 1100 of RAM 60 is also set so that when DM[1] is a 0 no TEG's are enabled and when DM[1] is a 1, TEG's DHA and DLA are enabled. TEG's DHA and DLA are programmed to respond to TS[3:0]=(1100) by producing their output pulses (when output enabled) at different times during the test cycle so that the test signal is driven high briefly and then low again during any cycle in which D[1] is a 1.

A "return to zero, data independent" format RZX is similar to the RZ format except that a pulse is produced during each cycle regardless of the value of D[1]. If we select TS[3:0]=(1010) as referencing the RZ format, the data at address 1010 of RAM 60 is set so that TEG's EH, DHA and DLA are always enabled regardless of the value of DM[1]. TEG EH is programmed to respond to TS[3:0]=(1010) by enabling the test signal at the start of the cycle while TEG's DHA and DLA are programmed to respond to TS[3:0]=(1010) by driving the test signal high and then low again during the test cycle.

A "surround by complement" format (SBC) produces a negative-going pulse when D[1] is a 0 and produces a positive-going pulse when D[1] is a 1. If the test signal is initially low when D[1] is a 0, the driver control circuit 32 drives it high before producing the negative-going pulse. Conversely, if the test signal is initially low when D[1] is a 0, the driver control circuit 32 drives it high before producing the negative-going pulse. Suppose TS[3:0]=(1111) is to reference the SBC format. Then data at address 1111 of RAM 60 is set so that TEG EH is enabled when TS[3:0] is (1111) and data stored in TEG EH is set to tell it to enable the test signal at the start of each test cycle. The data stored at address 1111 of RAM 60 also enables TEG's DHA, DHB and DLA when DM[1] is a 0 and enables TEG's DHA, DLA and DLB when DM[1] is a 1. The ENABLE output bit of decoder 62 enables TEG DHA when DM[1] is either a 0 or a 1 and the PAGE output bit of decoder 62 tells TEG DHA whether DM[1] was a 0 or a 1. When DM[1] is a 0, TEG DHA responds to TS[3:0]=(1111) by generating its output pulse early during the test cycle so as to quickly drive the test signal high if it is not already high. When DM[1] is a 1, TEG DHA responds to TS[3:0]=(1111) by generating its output pulse later during the cycle to produce the leading edge of a positive-going test signal pulse. The PAGE bit also tells TEG DLA whether the DM[1] bit was a 0 or a 1 since the timing of test signal trailing edges depends on the DM[1] bit. Note that the SBC format uses both drive high TEG's DHA and DHB and both drive low TEG's DLA and DLB since during any one test cycle the test signal may have as many as two leading edges or two trailing edges.

Doublet Mode Drive Circuit Programming

In the doublet mode, the currently addressed data in a RAM 72 (FIG. 3) determines the behavior of the output test signal waveform. RAM 72, addressed by the incoming 8-bit doublet mode vector, acts as a lookup table decoding incoming doublet mode vector to produce the enable and timeset signals for TEG's 54. RAM 72 supplies ENABLE and PAGE signals via multiplexers 64 and 68 to TEG's 54 and supplies timeset data via multiplexers 70 to TEG's 54 during doublet mode operation. RAM 72 may be programmed so that any value of a doublet mode vector can trigger any desired output test waveform pattern spanning two test cycles that is within the capability of TEG's 54. Note that whereas normal mode vectors bits TEG[3:0] and D[1:0] have specific functions, doublet mode bits can be defined any function depending on how RAM 72 is programmed. Also note that RAM 72 may send a different timeset value to each TEG 54 via multiplexers 70. This gives the doublet mode more flexibility in choosing drive formats and edge timing.

Figure 5:
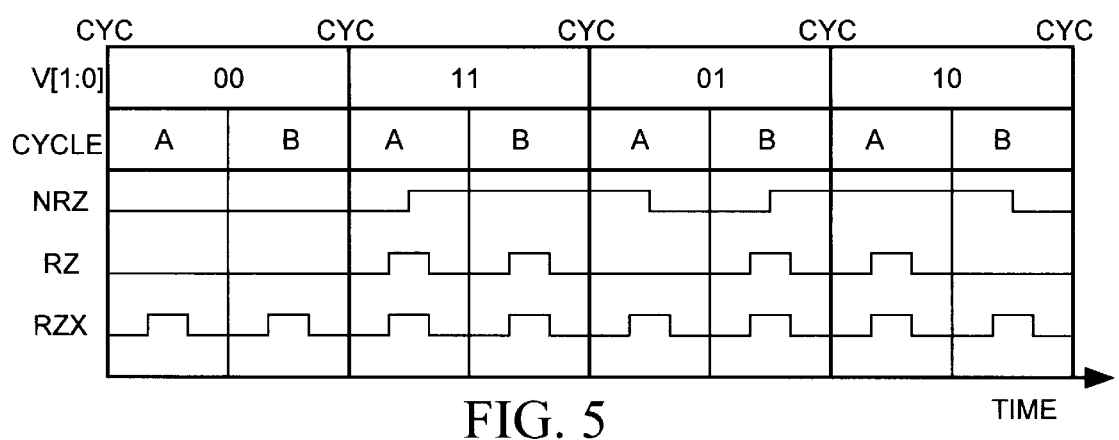

FIG. 5 is a timing diagram illustrating how the doublet mode implements three of the four drive formats (NRZ, RZ and RZX) illustrated in FIG. 4. As will be explained below, the SBC format illustrated in FIG. 4 does not appear in FIG. 5 because drive control circuit 32 is not capable of implementing the SBC format. In the doublet mode, a CYC pulse occurs only once every two cycles and each doublet mode vector defines test signal behavior during two consecutive test cycles. Thus we can think of each CYC signal cycle as being divided into two test cycles, A and B. Assume, for example, that data stored at RAM 72 addresses 0000000–00000011 defines the NRZ drive signal format. The 6 upper bits V[7:2]=(000000) of a doublet mode vector refer to the NRZ format and the two lower bits V[1:0] of the doublet mode vector indicate the drive state the two test cycles defined by the doublet mode vector. Thus for the first A/B cycle pair V[1:0] is (00), for the second A/B cycle pair V[1:0] is (11), for the third A/B cycle pair VECTOR[1:0] is (01) and for the fourth A/B cycle pair V[1:0] is (10). Four consecutive doublet mode vectors of values (00000000), (00000011), (00000001) and (00000010) tell the drive control circuit 32 to produce a waveform that is identical to the NRZ waveform shown in FIG. 4 produced by eight consecutive normal mode vectors, assuming that the period of the CYC signal for the doublet mode is twice that of the CYC signal for the normal mode. On the other hand, if the period of the CYC signal for the normal and doublet modes are the same, then the test frequency for the doublet mode will be twice that of the normal mode. Thus the tester operating in the doublet mode can run at twice its maximum normal mode frequency.

Referring to FIGS. 3 and 5, to implement the NRZ format the data at addresses 00000000–00000011 of RAM 72 of FIG. 3 is set to enable TEG EH so that it produces a pulse immediately after each CYC signal, thereby ensuring that the output test signal is enabled for all of cycles A and B. Data at RAM 72 address 00000000 also enables TEG DLA and tells TEG DLA to drive the test signal low at the midpoint of the A cycle if the test signal is high at the start of the cycle. (In the example of FIG. 5, the NRZ format test signal is already low at the start of the first A cycle, so there is no apparent change to the test signal at the midpoint of cycle A.) Data at RAM 72 address 00000011 also enables TEG DHA and tells TEG DHA to drive the test signal high at the midpoint of the A cycle. Data at RAM 72 address 00000001 also enables TEG's DLA and DHB, tells TEG DLA to drive the test signal low at the midpoint of the A cycle and tells TEG DHB to drive the test signal high at the midpoint of the B cycle. Data at RAM 72 address 00000010 also enables TEG's DHA and DLB, tells TEG DHA to drive the test signal high at the midpoint of the A cycle and tells TEG DLB to drive the test signal low at the midpoint of the B cycle. (Since the NRZ format test signal is already high at the start of the last A cycle, there is no apparent change to the test signal at the midpoint of cycle A.)

Addresses 00000100–00000111 of RAM 72 of FIG. 3 may, for example, be used to implement the RZ format waveform shown in FIG. 5. Data at all four address enable TEG EH and tell TEG EG to produce an output pulse on detecting CYC to ensure that the test signal is enabled. Data at RAM 72 address 00000100 does not enable any of TEG's DHA, DHB, DLA or DHB. Data at RAM 72 address 0000111 enables TEG's DHA, DHB, DLA and DLB. TEG DHA drives the test signal high early in the A cycle and TEG DLA drives the test signal low again later in the A cycle. Similarly, TEG DHB drives the test signal high early in the B cycle and TEG DLB drives the test signal low again later in the B cycle. Data at RAM 72 address 00000101 enables TEG's DHB and DLB so that TEG DHB drives the test signal high early in the cycle and TEG DLB dries the test signal low again later in the B cycle. Data at RAM 72 address 00000110 enables TEG's DHA and DLA so that TEG DHA drives the test signal high early in the A cycle and TEG DLA drives the test signal low again later in the A cycle.

Address 00001000 RAM 72 of FIG. 3 may, for example, be used to implement the RZX format waveform shown in FIG. 5. In this format the waveform is independent of the data carried by the D[1] bit of the normal mode vector. Since such data value need not be encoded into the doublet mode vector, only one RAM 72 address is needed to implement the RZX format. The data at this address enables TEG's DHA, DHB, DLA, DLB, and EH. Timeset data stored at that address tells TEG EH to output a pulse immediately so that the output test signal is enabled. The data at that RAM 72 address also tells TEG's DHA and DHB to drive the test signal high early in the A and B cycles and tells TEG's DLA and DLB to drive the test signal low again later in the A and B cycles.

The drive circuit 30 is not capable of implementing the SBC format in the doublet mode because it does not have enough TEG's 54. In both the normal and doublet modes, one TEG 54 is needed to control the timing of each test signal edge occurring between successive CYC pulses. In the SBC format, the output test signal may have as many as two rising edges or two falling edges during a given test cycle, so we need two drive high TEG's (DHA and DHB) and two drive low TEG's to implement the SBC format. Since in the normal mode the period between two CYC signal pulses defines one test cycle, the two drive high TEG's (DHA and DHB) and two drive low TEG's (DLA and DLB) are adequate to implement the SBC format. However in the doublet mode the period between two CYC pulses corresponds to two test cycles and the SBC format test signal may have up to three rising edges or three falling edges during any two successive test cycles. Thus drive control circuit 32 would need one additional drive high TEG and one additional drive low TEG to implement the SBC format. Thus while the doublet mode doubles tester frequency and/or halves the number of vectors needed to define a given number of test cycles, it cannot implement the more complex test signal formats that are possible in the normal mode.

Compare Circuit—Normal Mode

Figure 6:
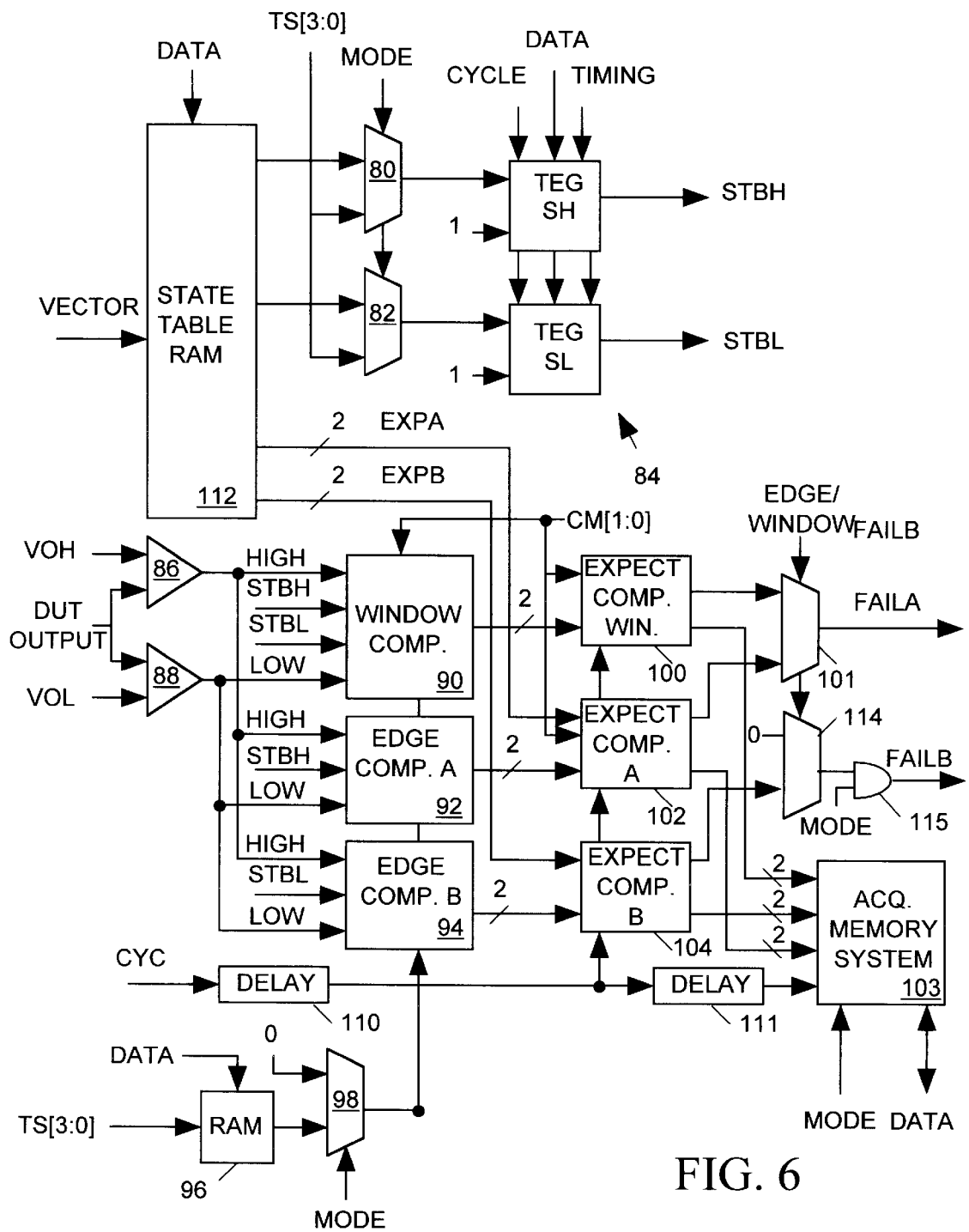

FIG. 6 illustrates the compare circuit 36 of FIG. 2 in more detailed block diagram form. Compare circuit 36 samples the DUT output signal, compares the sample to expected values and sends a FAIL signal back to sequencer 14 when the samples don't match expected values. It also stores the sample values as test result data in an internal acquisition memory which may be read and analyzed by the host computer 12 after the test.

Compare circuit 36 can use either an edge or window mode for determining the state of the DUT output signal. In the edge mode, circuit 36 samples the DUT output signal voltage at a particular moment during the test cycle and determines whether the sample is above the high logic level (VOH) or below the low logic level (VOL) indicated by the analog signals produced by DACs 42 and 44 of FIG. 2. In the window mode, compare circuit 36 monitors the DUT output signal for a particular period of time (a "window") during the test cycle to determine whether it rises above VOH or below VOL at any time during that time window.

The TS[3:0] bits of an incoming normal mode vector may be encoded to indicate times during a test at which the DUT output signal is to be sampled for high and low edge mode comparisons or may be encoded to indicate starting and ending times for the window comparison mode. In the normal mode of operation, a pair of multiplexers 80 and 82 apply the TS[3:0] bits of a normal mode vectors to a pair of time event generators 84 including a sample high TEG SH and a sample low TEG SL that are similar to TEG's 54 of FIG. 3. TEG's SH and SL, which are always enabled by hardwired logic state "1" input signals, each produce an output strobe pulse STBH or STBL at a certain time after detecting a pulse in a selected one of the TIMING signals from timing signal generator 34 of FIG. 2 as indicated by the incoming TS[3:0] timeset data. Each TEG 84 includes an internal RAM loaded by data from host computer 12 of FIG. 1 for decoding each timeset data value and setting the TEG to produce its output strobe at the appropriate time during the test cycle. Thus the STBH and STBL strobe timing can be individually adjusted.

A pair of comparators 86 and 88 compare the DUT output signal to the high and low logic levels VOH and VOL and supply logic signals HIGH and LOW indicating the results to each of a set of three time comparators 90, 92 and 94. HIGH is true if the DUT output signal level is higher than VOH, and LOW is true if the DUT output signal is lower than VOH. Window comparator 90 receives both the STBH and STBL strobes and produces two output data bits indicating whether HIGH or LOW were true at any time between the STBH and STBL strobes. Edge comparator 92 samples the HIGH and LOW signals in response to the STBH strobe and produces two output signals indicating the sample values. Edge comparator 94 samples the HIGH and LOW signals in response to the STBL strobe and produces two output bits indicating the sample values. The TS[3:0] timeset bits of a normal mode vector are applied as input to a RAM look-up table 96 which decodes the timeset bits to determine whether the edge or window mode is to be used. A multiplexer 98 routes the EDGE/WINDOW mode control signal output of RAM 96 to comparators 90, 92 and 94. Comparator 90 is enabled to implement the window mode is used and comparators 92 and 94 are enabled to implement the edge mode.

The CM[1:0] bits of a normal mode vector convey the expected high and low comparison results. In the window comparison mode, a window expect comparison circuit 100 compares the output data bits of comparison circuit 90 to the CM[1:0] bits to determine if the DUT output signal behaved as expected. If not, comparison circuit 100 sends a FAIL signal to the master sequencer 14 of FIG. 1 via a multiplexer 101. Comparison circuit 100 also forwards the two output bits of comparison circuit 90 to an acquisition memory 103.

In the edge mode of operation, an expect comparison circuit 102 compares the two output bits of comparison circuit 92 to the CM[1,0] bits to determine if they match and sends a FAIL signal to the master sequencer 14 of FIG. 1 via multiplexer 101. Comparison circuit 102 also sends the two output bits of comparison circuit 92 to acquisition memory 103. Delay circuits 110 and 111 delay the CYC signal to provide an output enable signal to comparison circuits 100–104 and a write control input to acquisition memory 103. The delays allow the comparison logic time sufficient settling time after each CYC pulse before the FAIL signals are sent to the master sequencer and comparison results written into the acquisition memory 103.

Compare Circuit—Doublet Mode

In the doublet mode, a state table RAM 112 loaded with data from host computer 12 of FIG. 1, decodes an incoming doublet mode vector to produce timeset data passed via multiplexers 80 and 82 to the high and low strobe TEG's 84. RAM 112 also supplies two expect data bits EXPA and EXPB to each of cycle A expect comparison circuit 102 and cycle B expect comparison circuit 104. The doublet mode employs only edge mode comparisons for the A and B doublet cycles occurring between successive CYC pulses. Expect logic circuit 102, which also receives the EXPA data from RAM 112 supplies a FAILA to the central sequencer via multiplexer 101 for each A cycle when the output of comparator 92 does not match the expected values EXPA for a doublet mode cycle A. Another expect logic circuit 104 supplies a FAILB signal to the central sequencer via a multiplexer 114 for each B cycle when the output of edge comparator 94 does not match expected data value EXPB for each B cycle. Both expect compare circuits 102 and 104 supply the two-bit outputs of comparators 92 and 92 to acquisition memory system 103. Delays 110 and 111 are set so that the memory system 103 stores the data from both comparison circuit 102 and 104 at the end of the B cycle.

As an example of doublet mode compare operation, assume RAM 112 addresses 11111000 to 111111111 contain data define a particular compare mode format. The upper five bits of the vector V[7:2]=11111 could reference the sample timing to be used during the A and B test cycles and the lower three bits of the vector V[2:0] could encode the expected data for the two cycles, EXPA and EXPB. When RAM 112 decodes the doublet mode vector, it sends timing data to TEG SH telling it to generate the STBH strobe at an appropriate time during doublet cycle A and sends data to TEG SL telling it to generate the STBL strobe at an appropriate time during doublet cycle B. For the A cycle, edge comparator 92 and expect comparator 102 respond to the STBH signal and EXPA data by supplying the appropriate sample data to acquisition memory system 103 and sending the FAILA signal to the master sequencer. For the B cycle, edge comparator 94 and expect comparator 104 respond to the STBL signal and EXPB data by supplying the appropriate sample data to acquisition memory system 103 and sending the FAILB signal to the master sequencer.

Figure 7:
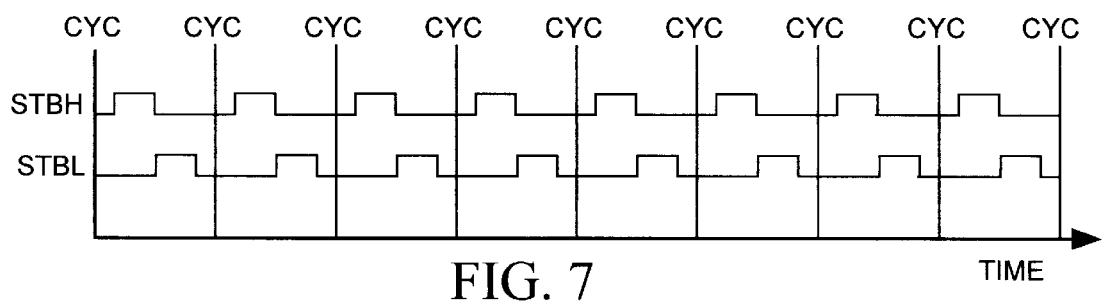

FIG. 7 is a timing diagram illustrating an example of the timing of the STBH and STBL strobe signals which can be provided by TEG's 84 during normal mode operation. In this mode, where each CYC pulse marks the beginning of a test cycle, one STBH strobe and one STBL strobe may occur during each test cycle with the timing of the two strobe pulses being determined by the value of the TS[3:0] timeset data included in the incoming normal mode vector. The STBH strobe is used as a reference for edge mode comparison while the STBH and STBL strobes are both used for window mode comparison. Window comparison is possible in the normal mode of operation because fore each test cycle, the STBH strobe is available to mark the start of the comparison window and the STBL strobe is available to mark the ending of the comparison window for each test cycle.

Figure 8:
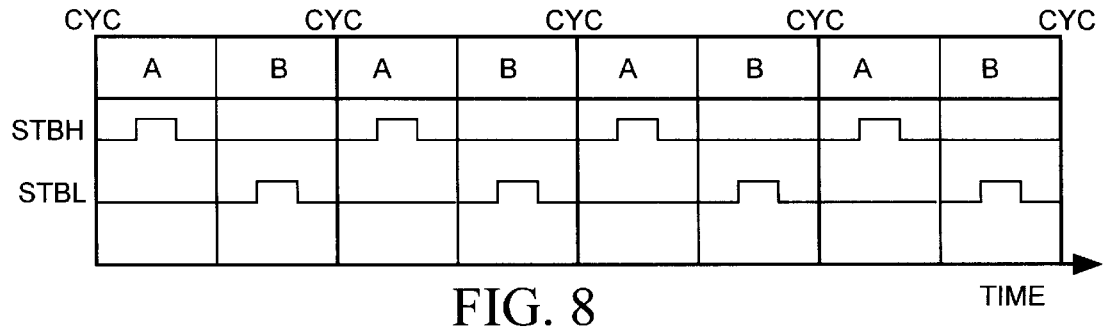

FIG. 8 is a timing diagram illustrating an example of the timing of the STBH and STBL strobe signals provided during doublet mode operation. In this example the STBH strobe appears during each A test cycle whereas the STBL strobe appears during each B test cycle. The timing of the STBH and STBL strobes is controlled by data from RAM 112. Since there are two test cycles after each CYC pulse, since each STBH and STBL strobe can only occur once after each CYC signal pulse, and since a strobe is needed during each test cycle, the circuit cannot provide two pulses during any given test cycle. Since two pulses are required for window comparison, window comparison is not available in the doublet mode. However one skilled in the art will understand that the circuit of FIG. 6 could be adapted to provide window comparison in the doublet mode by doubling the number of TEG's so that two strobes could be produced during each doublet mode test cycle. The circuit of FIG. 6 would also have to be modified to include window comparison circuits and expect circuit for both A and B cycles.

Thus has been described an integrated circuit tester including a set of pin electronics circuits, each carrying out a sequence of activities at a separate terminal of a device under test (DUT) in response to an input vector sequence. When operating in a normal mode, each pin electronics circuit interprets each input vector as defining activities to be carried out during a single test cycle. When operating in the doublet mode, the pin electronics circuit interprets each input vector as defining activities to be carried out during two successive test cycles. While normal mode vectors can define more complicated test signal and sampling formats than doublet mode vectors, doublet mode vectors make more efficient use of vector memory than normal mode vectors. Doublet mode vectors not only speed up vector memory loading and increase the number of test cycles that can be defined by a vector sequence, they also allow the tester can to operate with a test cycle period as low as half of the vector memory access time. With the capability of selectively implement either normal or doublet modes, an integrated circuit tester in accordance with the invention has the flexibility to handle a wide range of circuit tests.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A circuit tester for carrying out a sequence of test activities at a plurality of terminals of a circuit during a plurality of test cycles, the tester comprising:

a plurality of pin electronics circuits, each being connected to a separate one of said terminals, each for carrying out test activities at the terminal to which it is connected in response to normal and doublet mode vectors supplied as input thereto, wherein each normal mode vector references activities to be carried during a separate one of said test cycles and wherein each doublet mode vector references activities to be carried out during more than one of said test cycle; and means for supplying normal mode and doublet mode vectors as input to each of said plurality of pin electronics circuits.

2. The circuit tester in accordance with claim 1 wherein ones of said vectors reference a first activity of generating a test signal pattern at a circuit terminal and others of said vectors reference a second activity of determining a state of a circuit output signal produced at a circuit terminal, and wherein each pin electronics circuit comprises:

drive control means for receiving each input vector and for carrying out said first activity when referenced by said input vector; and compare control means for receiving each input vector and for carrying out said second activity when referenced by said input vector.

3. The circuit tester in accordance with claim 2 wherein said drive control means comprises:

a plurality of drive high circuits, each for driving said test signal high at a time indicated by first control data, a plurality of drive low circuit, each for driving said test signal low at a time indicated by second control data, first decoding means for decoding each input normal mode vector to generate said first and second control data such that said drive high and drive low circuits control a state of said test signal during only one test cycle, and second decoding means for decoding each input doublet mode vector to generate said first and second control data such that said drive high and drive low circuits control a state of said test signal during more than one test cycle.

4. An pin electronics circuit for a circuit tester, the pin electronics circuit comprising:

drive control means for responding to an input sequence of vectors by sending a test signal to a terminal of a circuit being tested during each of a plurality of successive test cycles, wherein said drive control means operates selectively in either of a normal mode and a doublet mode, wherein when operating in the normal mode said drive control means interprets each vector of said sequence as referencing a test signal pattern to be generated during one of said test cycles, and wherein when operating in the doublet mode said drive control means interprets each vector of said sequence as referencing a test signal pattern to be generated during more than one of said test cycles; and compare means for responding to said input sequence of vectors by ascertaining a state of a signal appearing at said terminal at times during each of said plurality of successive test cycles, wherein said compare means operates selectively in either of a normal mode and a doublet mode, wherein when operating in the normal mode said compare means interprets each input vector as indicating when to ascertain the state of said signal during one of said test cycles, and interprets when operating in the doublet mode said compare means interprets each vector as referencing times during more than one of said test cycles at which to ascertain the state of said signal.

5. A drive control circuit for an integrated circuit tester, the drive control circuit responding to input normal and doublet mode vectors by generating an output test signal during each of a set of test cycles, the drive control circuit comprising:

drive high means for driving the test signal to a high logic state at times controlled by input first control data, drive low means for driving the test signal to a low logic state at times controlled by input second control data, first decoding means for responding to each input normal mode vector by generating first and second control data for controlling said drive high means and said drive low means during only one of said test cycles, and second decoding means for responding to each input doublet mode vector by generating first and second control data for controlling said drive high means and said drive low means during more than one of said test cycles.

6. The drive control circuit in accordance with claim 5 wherein all normal and doublet mode vectors consist of similar numbers of bits.

* * * * *